United States Patent
Liaw

(10) Patent No.: US 9,892,781 B2
(45) Date of Patent: Feb. 13, 2018

(54) CELL STRUCTURE FOR DUAL-PORT STATIC RANDOM ACCESS MEMORY

(71) Applicant: Taiwan Semiconductor Manufacturing Co., Ltd., Hsin-Chu (TW)

(72) Inventor: Jhon Jhy Liaw, Hsinchu County (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 15/231,238

(22) Filed: Aug. 8, 2016

(65) Prior Publication Data

US 2018/0005691 A1    Jan. 4, 2018

Related U.S. Application Data

(60) Provisional application No. 62/357,148, filed on Jun. 30, 2016.

(51) Int. Cl.
 *G11C 11/00*    (2006.01)
 *G11C 11/412*   (2006.01)
(52) U.S. Cl.
 CPC .................. *G11C 11/412* (2013.01)
(58) Field of Classification Search
 CPC ........................................... G11C 11/41–11/419
 USPC .............................................. 365/154, 49.11
 See application file for complete search history.

(56) References Cited

U.S. PATENT DOCUMENTS

| | | |
|---|---|---|
| 8,258,572 B2 | 9/2012 | Liaw |
| 8,605,523 B2 | 12/2013 | Tao et al. |
| 8,630,132 B2 | 1/2014 | Cheng et al. |
| 8,760,948 B2 | 6/2014 | Tao et al. |
| 8,809,963 B2 | 8/2014 | Liaw |
| 2011/0075470 A1* | 3/2011 | Liaw .................. G11C 8/16 365/154 |
| 2011/0317477 A1* | 12/2011 | Liaw .................. G11C 8/16 365/156 |
| 2013/0141962 A1* | 6/2013 | Liaw .................. G11C 11/412 365/154 |
| 2013/0235652 A1* | 9/2013 | Liaw .................. H01L 27/0207 365/156 |
| 2014/0032871 A1 | 1/2014 | Hsu et al. |
| 2014/0153321 A1 | 6/2014 | Liaw |
| 2014/0153345 A1 | 6/2014 | Kim et al. |
| 2014/0177352 A1 | 6/2014 | Lum |

(Continued)

*Primary Examiner* — Han Yang
(74) *Attorney, Agent, or Firm* — Haynes and Boone, LLP

(57) ABSTRACT

A dual port static random access memory cell includes a write port portion and a read port portion. The write port further includes a WPU1 and a WPU2; a WPD1 and a WPD2; and a WPG1 and a WPG2. The WPU1, WPU2, WPD1 and WPD2 are configured to form two cross-coupled inverters for data storage, wherein the WPG1 and WPG2 are connected to the two cross-coupled inverters for writing. The read port portion further includes a read pull down device (RPD) and a read pass gate device (RPG) connected to the two cross-coupled inverters for reading. Each of the WPU1 and WPU2 includes a single FinFET. Each of the WPD1, WPD2, WPG1, WPG2, RPD and RPG includes multiple FinFETs. The WPD1, WPD2, WPG1 and WPG2 include a same number of FinFETs. The RPD includes a number of FinFETs greater than a number of FinFETs in the RPG.

20 Claims, 9 Drawing Sheets

(56) References Cited

U.S. PATENT DOCUMENTS

2014/0233330 A1 8/2014 Ko et al.
2014/0241077 A1 8/2014 Katoch et al.
2014/0269114 A1 9/2014 Yang et al.
2017/0200491 A1* 7/2017 Liaw .................... G11C 11/419

* cited by examiner

CELL STRUCTURE FOR DUAL-PORT STATIC RANDOM ACCESS MEMORY

This application claims the benefit of U.S. Provisional Application 62/357,148 entitled "CELL STRUCTURE FOR DUAL-PORT SRAM," filed Jun. 30, 2016, herein incorporated by reference in its entirety.

BACKGROUND

In deep sub-micron integrated circuit technology, an embedded static random access memory (SRAM) device has become a popular storage unit of high speed communication, image processing and system-on-chip (SOC) products. A dual port (DP) SRAM device allows parallel operation, such as 1R (read) 1W (write), or 2R (read) in one cycle, and therefore has higher bandwidth than a single port SRAM. In advanced technologies with decreased feature size and increased packing density, low loading and high speed of the cell structure are important factors in embedded memory and SOC products. The thin style SRAM cell structure with short bit-line (BL) provides better performance on BL RC delay. For example, the thin style SRAM cell provides active regions, gates and metal lines with shapes friendly to lithography processes. However, the thin style cell has long word line. The length ratio of word line over bit line (WL/BL) is usually greater than 2 or even 3. In a dual port SRAM cell, the ratio WL/BL is even greater than 3.5. This short bit line can only benefits metal layer coupling capacitance but coupling capacitances associated with the front end of line (such as active regions and gates) and the middle end of line (such as contacts) are not improved. This even becomes a speed-limiting factor when it is used in fin field effect transistors (FinFETs) with long contact structure. This structure suffers various problems, such as long including data node leakage; devices matching of pull-down (PD)/pass-gate (PG) devices; and current crowding, etc. It is therefore desired to have a new structure and method to address the above issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Various drawings and associated text are provided in a Power Point file. Particularly.

DETAILED DESCRIPTION

Figure 1:
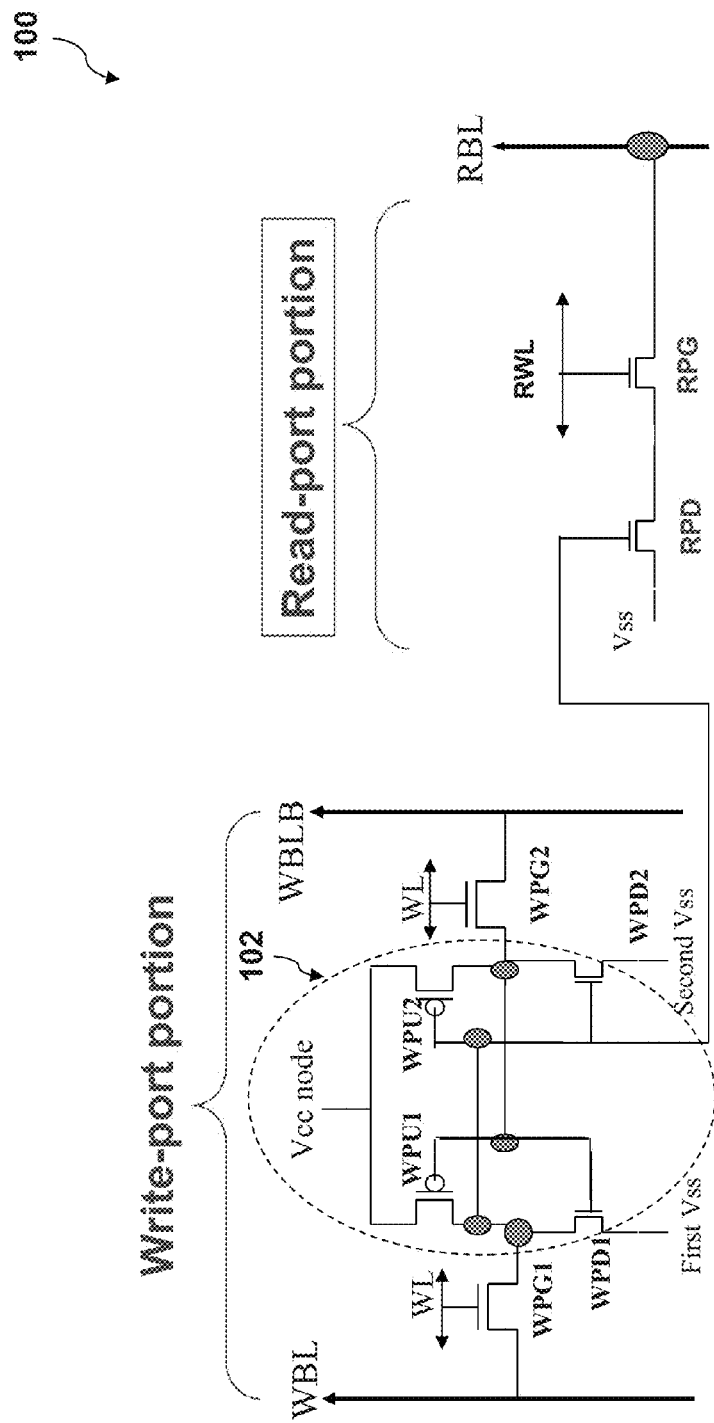
FIG. 1 is a schematic view of a dual port static random access memory (DP SRAM) device constructed according to various aspects of the present disclosure in one embodiment.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a schematic view of a dual-port (DP) SRAM cell 100 constructed according to various aspects of the present disclosure in one embodiment. The DP SRAM cell 100 is formed on fin active regions and includes fin field-effect transistors (FinFETs). The DP SRAM cell 100 includes a first inverter and second inverter that are cross-coupled to form a data storage unit 102. The first inverter includes a first pull-up device formed with a p-type fin field-effect transistor (pFinFET). The first inverter also includes a first pull-down device formed with two or more n-type fin field-effect transistor (nFinFETs). The second inverter includes a second pull-up device formed with a pFinFET. The second inverter also includes a second pull-down device formed with two or more nFinFETs. The DP SRAM cell 100 further includes various pass gate devices (PGs) and pull-down devices (PDs) connected to the cross-coupled inverters and configured to form two ports for reading and writing.

Particularly, as illustrated in FIG. 1, the DP SRAM cell 100 includes a write-port portion and a read-port portion. The write-port portion includes a first pull-up device (WPU1) and a first pull-down device (WPD1) connected and configured to form the first inverter. The write-port portion includes a second pull-up device (WPD2) and a second pull-down device (WPD2) connected configured to form a second inverter, which is cross-coupled with the first inverter. The write port portion further includes a first pass gate (WPG1) and a second pass gate (WPG2) connected to the cross-coupled inverters. The gates of the WPG1 and WPG2 are connected to write word lines (WL). The drain of the WPG1 is connected to a first bit line (WBL) and the drain of the WPG2 is connected to a second bit line (WBLB). The read port portion includes a pull down device (RPD) and pass gate device (RPG) connected in series. The gate of the RPG is connected to a read word line (RWL) and the drain of the RPG is connected to a read bit line (RBL).

The DP SRAM cell 100 is formed on multiple fin active regions. The PU1 and PU2 are formed on a single fin active region such that the PU1 includes a single FinFET and the PU2 includes a single FinFET (both are p-type FinFETs or pFinFETs). Other devices are formed on multiple fin active regions, respectively. Specifically, the read port portion adopts a non-symmetric structure with different numbers of fin active regions for RPD and RPG. The RPD includes a first number n1 FinFETs (n1 nFinFETs) and is formed on n1 fin active regions. Those n1 FinFETs are configured in parallel mode, which means that the drains of the n1 FinFETs are electrically connected together, the corresponding sources are electrically connected together, and the corresponding gates are electrically connected together. The RPG includes a second number n2 FinFETs (n2 nFinFETs) and is formed on n2 fin active regions. Those n2 FinFETs are configured in parallel mode as well. The second number n2 is less than the first number n1. In some embodiments, the ratio n1/n2 is 3/2. In the present embodiment, n1 is 3 and n2 is 2. In furtherance of the present embodiment, each of WPD1, WPD2, WPG1 and WPG2 includes two FinFETs and is formed on two fin active regions. By this non-symmetric structure of the read port portion in the DP SRAM cell 100, the SRAM cell performance is improved. Less number of FinFETs in the RPG reduces bit line capacitance and leakage, and more number of FinFETs in the RPD provides improvement to read current $I_{read}$. In the embodiments, fin active regions in the read port portion are configured with different fin space settings for RPD to enhance fabrication capability (such as process window), which will be further described later.

Figure 2:
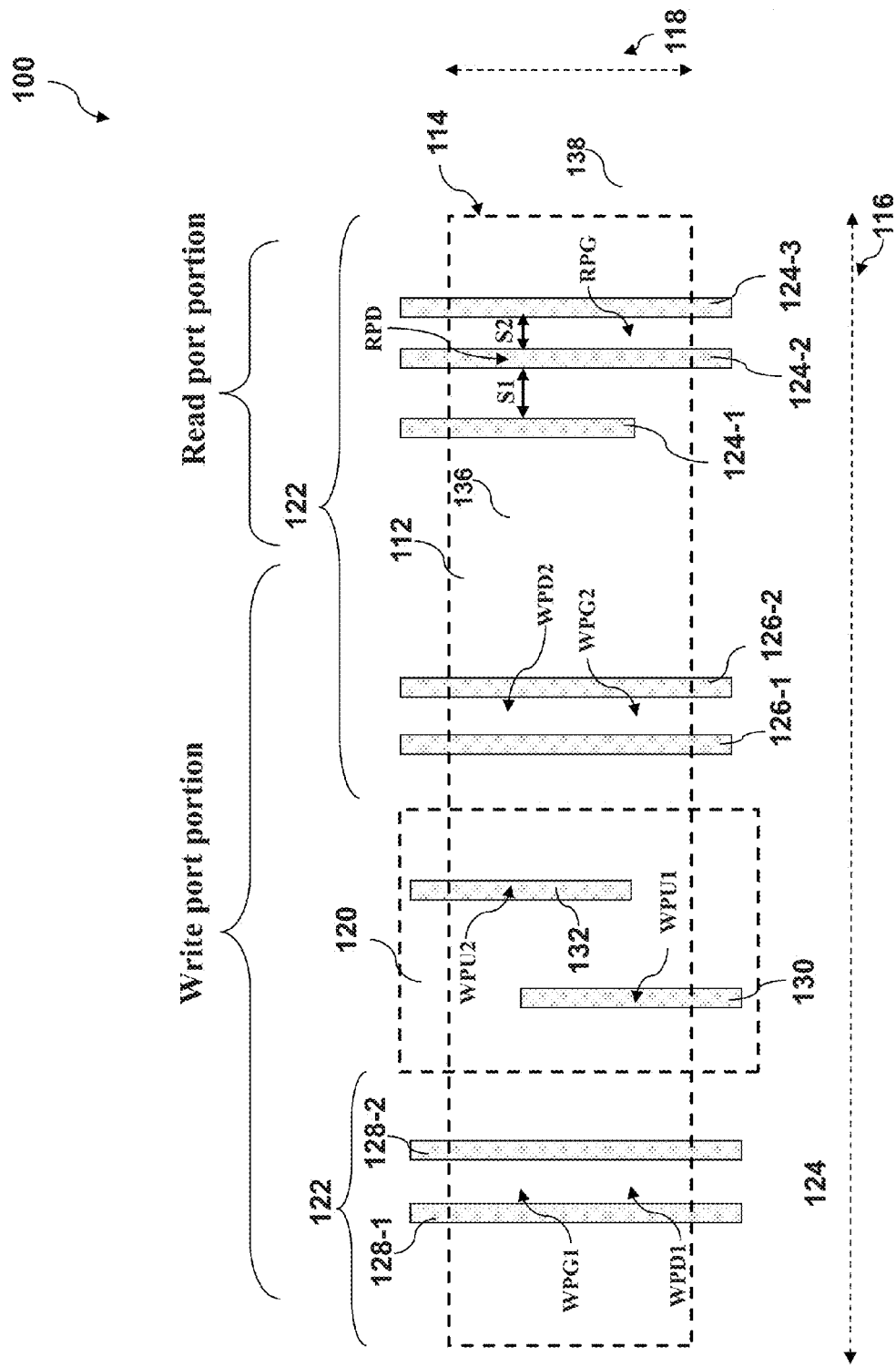
FIG. 2 is a top view of a DP SRAM device, in accordance with some embodiments.

The DP SRAM cell 100 is further described with detailed layout in accordance with some embodiments. FIG. 2 is a top view of a DP SRAM cell 100 constructed according to various aspects of the present disclosure in one embodiment. The DP SRAM cell 100 includes one cell of DP SRAM and is formed on a semiconductor substrate. The semiconductor substrate includes silicon. Alternatively, the substrate includes germanium, silicon germanium or other proper semiconductor materials. The semiconductor substrate may include other proper features and structures. In one embodiment, the semiconductor substrate employs a layer of semiconductor material formed over an insulating layer on a supporting bulk wafer for isolation. The technology and structure are referred to as semiconductor on isolation (SOI). The SOI structure can be formed by different techniques including separation by implanted oxygen (SIMOX), bonding and etching back (BESOI), and zone melting and recrystallization (ZMR).

The DP SRAM cell 100 is formed in a unit cell region 112 of the semiconductor substrate. The unit cell region 112 is defined by the unit cell boundary 114. In one embodiment, the unit cell region 112 is defined in a rectangular shape spanning to a first dimension 116 in a first direction and spanning to a second dimension 118 in a second direction perpendicular to the first direction. The first dimension 116 is longer than the second dimension 118. The first and second dimensions (116 and 118) are referred to as a longer pitch and a shorter pitch, respectively. The first and second directions are also referred to by numerals 116 and 118, respectively. In one embodiment, a ratio of the first dimension over the second dimension is greater than 3. The SRAM cell 100 includes an N-well region 120 disposed in the middle portion of the cell. The SRAM cell 100 further includes a P-well region 122 disposed on the both sides of the N-well 120. In one embodiment, the N-Well 120 and P-well 122 are extended to multiple cells beyond the unit cell boundary. For example, the N-well 120 and P-well 122 are extended to 4 or more cells in the second direction.

Various active regions are defined in the substrate by isolation features and are isolated from each other by the isolation features. The isolation features are formed in the semiconductor substrate with a proper technology. In one embodiment, the isolation features are formed by shallow trench isolation (STI) technique. In another embodiment, the isolation features are alternatively formed by a local oxidation of silicon (LOCOS) technique. In yet another embodiment, the formation of the STI features includes etching a trench in a substrate and filling the trench by one or more insulator materials such as silicon oxide, silicon nitride, or silicon oxynitride. The filled trench may have a multi-layer structure such as a thermal oxide liner layer with silicon nitride filling the trench. The active regions are defined in the semiconductor substrate upon the formation of the isolation features.

The DP SRAM cell 100 utilizes fin active regions (fin active features) to form fin transistors, such as FinFETs. The fin active regions are formed on the semiconductor substrate and defined within the SRAM cell 100. The fin active regions are formed by a suitable technology and may be formed in a process to form both the STI features and the fin active regions. In one embodiment, the fin active regions are formed by a process including etching a semiconductor to form trenches, partially filling the trenches to form shallow trench isolation (STI) features and fin active regions interdigitized with each other. In furtherance of the present embodiment, an epitaxy semiconductor layer is selectively formed on the fin active region. In another embodiment, the fin active regions are formed by a process including depositing a dielectric material layer on a semiconductor substrate, etching the dielectric material layer to form openings thereof, and selective epitaxy growing a semiconductor material (such as silicon) on the semiconductor substrate within the openings to form fin active regions and the isolation features. In yet another embodiment, the various FinFETs may include strained features for enhanced mobility and device performance. For example, the pFinFETs include epitaxy grown silicon germanium on a silicon substrate. The pFinFETs include epitaxy grown silicon carbide on the silicon substrate.

In one embodiment, the DP SRAM cell 100 includes a first active region 124, a second active region 126 and a third active region 128 formed in the P-well 122. The DP SRAM cell 100 further includes a fourth active region 130 and a fifth active region 132 formed in the N-well 120. The first active region 124 through the fifth active region 132 are disposed in parallel and oriented along the second dimension 118. The first through fifth active regions or a subset thereof may be extended to multiple cells, such as 4 or more cells in the second direction.

Each of the active regions includes one or more fin active features configured to form various FinFETs. In the present embodiment, each of the active regions 124 through 128 in the P-well 122 includes multiple fin active features (also referred to fin active regions); and each of the active regions 130 through 132 in the N-well 120 includes a single fin active feature (also referred to fin active region). In fin active feature, a pull-down device (PD), a pass-gate device (PG), a FinFET thereof, or a combination thereof is formed. Particularly, one or more FinFETs formed on each fin active feature.

Figure 3:
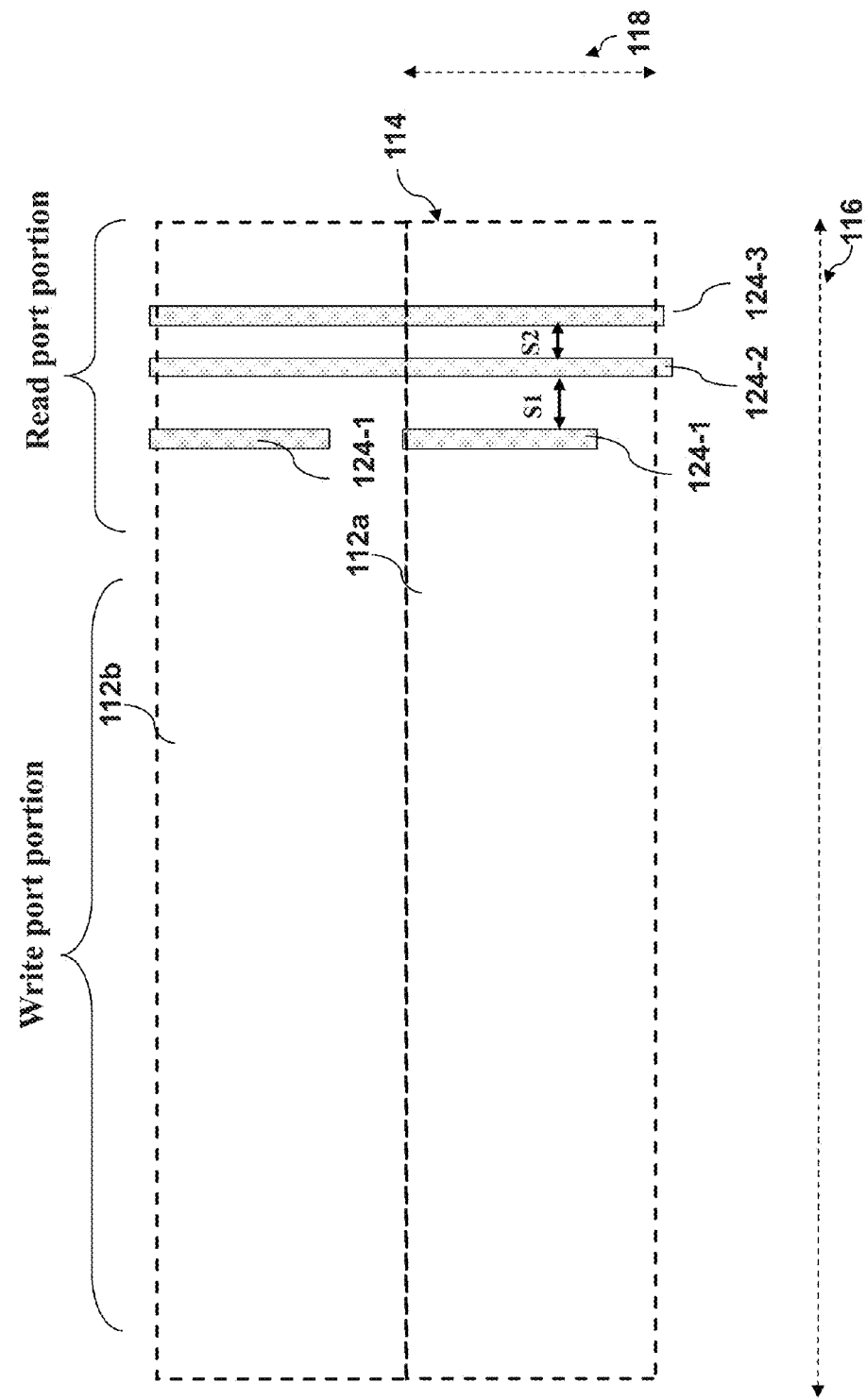
FIG. 3 is a top view of a DP SRAM device having multiple DP SRAM cells, in accordance with some embodiments.
Figure 4:
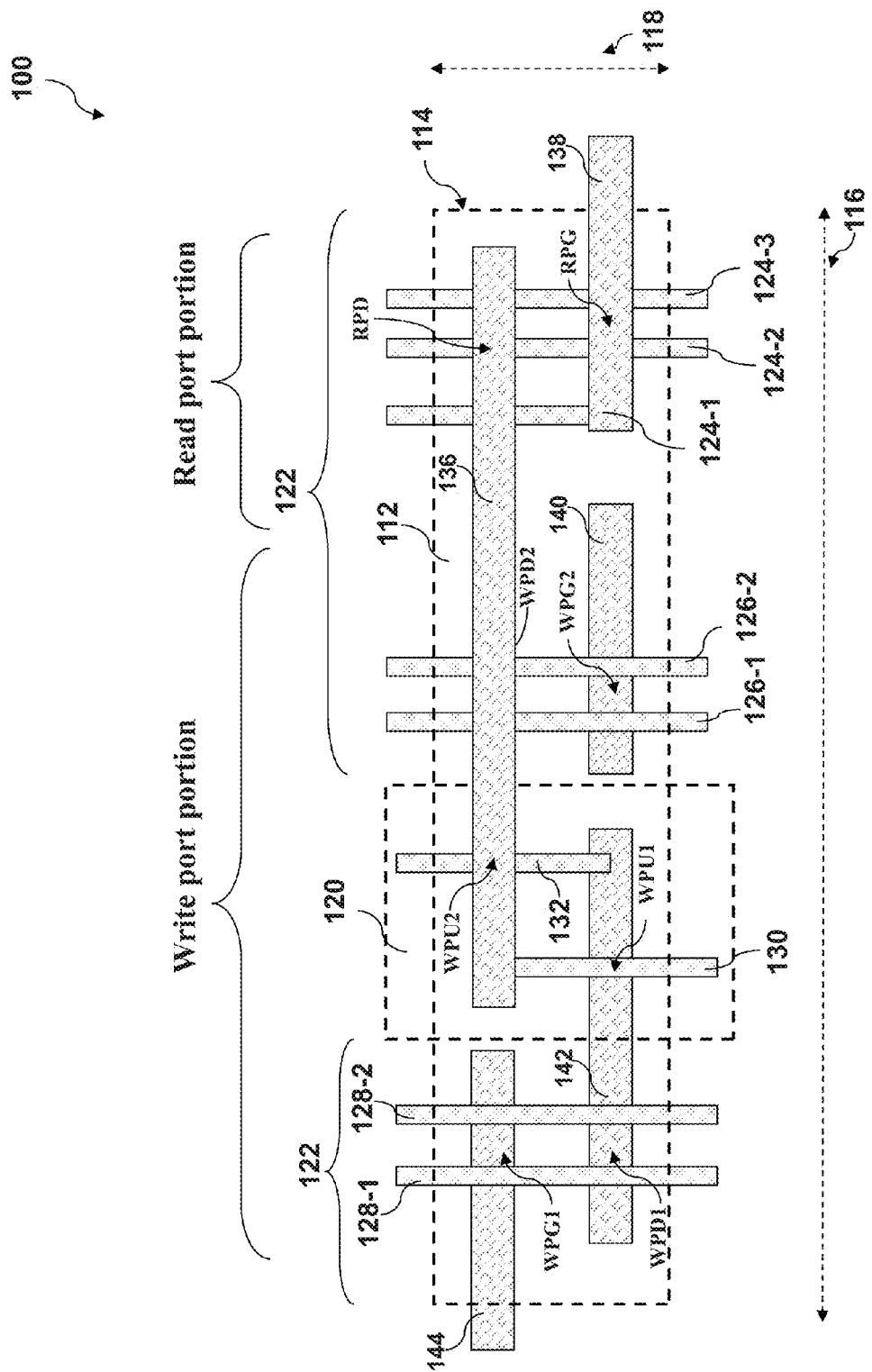
FIGS. 4, 5, 6 and 7 are top views of a DP SRAM device, in accordance with some embodiments.

In the present embodiment, the first active region 124 includes three fin active feature (referred to as 124-1, 124-2 and 124-3, respectively) oriented in the second direction 118. The pass gate device RPG and the pull-down device (RPD) of the read port portion are form on the three fin active features 124. The three fin active features are designed and configured to have a non-symmetric structure with different lengths and different spaces. The first fin active feature 124-1 has a first length along the second direction 118. The second fin active feature 124-2 and third fin active feature 124-3 have a second length along the second direction 118. The second length is greater than the first length. Especially, each of the second and third fin active regions (124-2 and 124-3) is a continuous fin active feature that extends through the unit cell boundary from both ends while the first fin active feature 124-1 has a discontinuous structure. It is further illustrated in FIG. 3. FIG. 3 is a top view of multiple DP SRAM cells, in portion, constructed in accordance with some embodiments. In the present embodiment, illustrated in FIG. 3 are two exemplary DP SRAM cells (112a and 112b) configured to be adjacent each other. The second and third fin active regions (124-2 and 124-3) continuously extend through multiple SRAM cells, such as 2 or 4 DP SRAM cells, in some examples. The first fin active feature 124-1 has a discontinuous structure. The first fin active feature 124-1 in the DP SRAM cell 112a and the first fin active feature 124-1 in the DP SRAM cell 112*b* are not connected. In the present embodiment, due to advanced technologies with reduced feature sizes, the discontinuous fin active features 112-1 in the multiple cells are formed by a multiple-patterning procedure that include two or more patterning operations. For example, the multiple-patterning procedure may include performing a cut patterning operation to form this discontinuous structure. In this case, the cut patterning operation may inadvertently cut the adjacent fin active feature, such as the second fin active feature 124-2, due to overlay shift. In the present embodiment, the three fin active features in the read port are designed to have different spaces. Specifically, the first fin active feature 124-1 is spaced away from the second fin active feature 124-2 in the first direction 116 with a first space S1 and the second fin active feature 124-2 is spaced away from the third fin active feature 124-3 in the first direction 116 with a second space S1 less than the first space 51, thus providing large process window. In some examples, the ratio S1/S2 is greater than 1.2.

Back to FIG. 2, in the present embodiment, the RPG is formed on the two fin active features (124-2 and 124-3) lined up, and therefore includes two FinFETs configured in parallel mode. In the parallel mode, corresponding sources are electrically connected together, collectively referred to as common source or simply source; corresponding drains are electrically connected together, collectively referred to as common drain or simply drain; and corresponding gates are electrically connected together, collectively referred to as common gate or simply gate. The RPD is formed on the three fin active features (124-1, 124-2 and 124-3), and therefore includes three FinFETs configured in parallel mode. By this non-symmetric structure of the read port portion, the DP SRAM cell 100 has an enhanced performance. Less number of FinFETs in the RPG reduces bit line capacitance and leakage, and more number of FinFETs in the RPD provides improvement to read current $I_{read}$.

The second active region 126 includes two fin active features (126-1 and 126-2) lined up in accordance with the present embodiment. In some examples, the fin active features (126-1 and 126-2) are continuous features and extend along the second direction 118 through two or more DP SRAM cells. The WPD2 and WPG2 are formed on the two fin active features (126-1 and 126-2), and therefore each includes two FinFETs configured in parallel mode.

The third active region 128 includes two fin active features (128-1 and 128-2) lined up in accordance with the present embodiment. In some examples, the fin active features (128-1 and 128-2) are continuous features and extend along the second direction 118 through two or more DP SRAM cells. The WPD1 and WPG1 are formed on the two fin active features (128-1 and 128-2), and therefore each includes two FinFETs configured in parallel mode.

In the N-well 120, each of the fourth active region 130 and the fifth active region 132 includes a single fin active feature, referred to as fin active features 130 and 132, respectively. The fin active features (126-1 and 126-2) are discontinuous structure. The WPU1 and WPU2 are formed on the two fin active features (126-1 and 126-2), and therefore each includes only a single FinFET.

Referring to FIG. 2, various gate features are formed within the DP SRAM cell 110 for various nFinFETs and pFinFETs. A gate feature includes a gate dielectric layer (such as silicon oxide) and a gate electrode (such as doped polysilicon) disposed on the gate dielectric layer. In another embodiment, the gate feature alternatively or additionally includes other proper materials for circuit performance and manufacturing integration. For example, the gate dielectric layer includes high k dielectric material layer. The gate electrode includes metal, such as aluminum, copper, tungsten or other proper conductive material. Various gates are oriented in the first direction 116 and configured with the various active regions to form various pull-up devices, pull-down devices and pass-gate devices.

In the present embodiment, a long gate 136 is disposed over the fin active features 124-1, 124-2, 124-3, 126-1 and 126-2 and further extends over the fin active feature 132, forming RPD, WPD2 and WPU2, respectively. Another gate 138 is disposed over the fin active features 124-2 and 124-3, forming RPG having two FinFETS. The first fin active feature 124-1 in the read port portion, as a discontinuous feature, extends to under the gate 138 and ends in an area directly underlying the gate 138. A gate 140 is disposed over the fin active features 126-1 and 126-2, forming WPG2 having two FinFETS.

A gate 142 is disposed over the fin active features 128-1 and 128-2 and further extends over the fin active feature 130, forming WPD1 and WPU1, respectively. Another gate 144 is disposed over the fin active features 128-1 and 128-2, forming WPG1.

Figure 5:
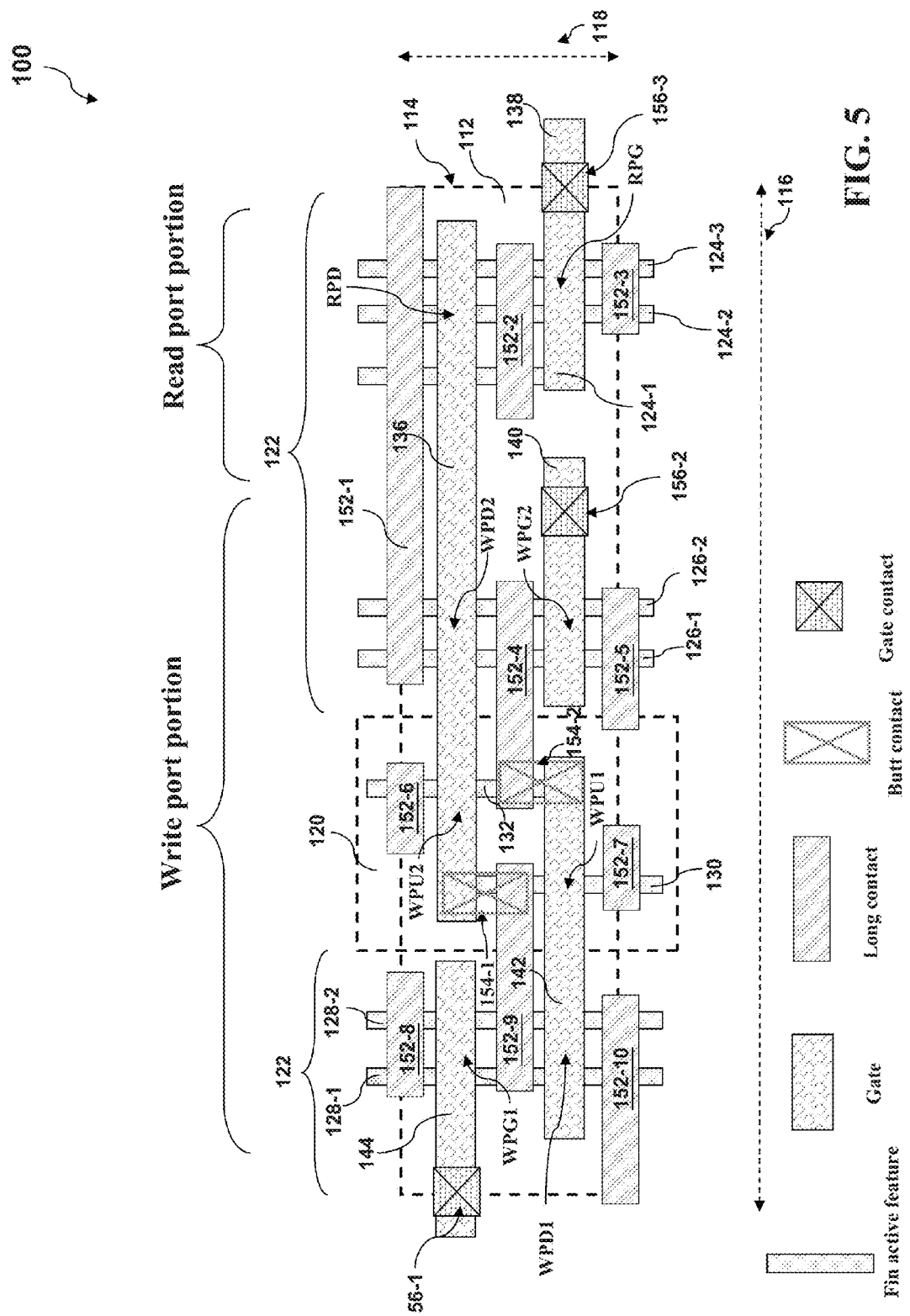

FIG. 5 illustrates a top view of the DP SRAM cell 100, including interconnect routings (such as contacts) in accordance with some embodiments. Various interconnect structures may be utilized to couple the nFinFETs and pFinFETs to form the functional DP SRAM cell. Various contacts are formed on gates, drain nodes, and various landing pads (such as silicide feature). The contact features are positioned and configured for routing including electrically connecting the doped regions or the gates to a metal layer. Those contacts may be further designed to have various shape such that to provide local connections between adjacent sources or drains.

In one embodiment, elongated contact features (long contacts) 152 (such as those 152-1 through 152-10) are configured to provide local interconnections. For examples, the long contact 152-1 is configured to electrically connect the source of the RPD and the source of WPD2. In another example, the source of the WPG2 is electrically connected with the drain of the WPD2 and the drain of the WPU2 by the long contact 152-4. In yet another example, the source of the WPG1 is electrically connected with the drain of the WPD1 and the drain of the WPU1 by the long contact 152-9. The long contacts may be formed in a process that includes lithography patterning, etching and deposition. The long contacts may include a conduct material such as silicide, metal, metal alloy, doped poly-silicon, other suitable conductive material or a combination thereof. A silicide feature is formed by a process known in the art such as self-aligned silicide (salicide) and can be formed together with other contact silicide in a same or similar processing procedure.

The DP SRAM cell 100 also includes one or more butt contact 154 (such as 154-1 and 154-2) designed to provide local interconnect between a source/drain of a transistor to a gate of an adjacent transistor. In the present example, WPD1 and WPU1 share a common drain by the long contact 152-9 as a first data node. WPD2 and WPU2 share a common drain by the long contact 152-4 as a second data node. WPD1 and WPU1 share a common gate 142. WPD2 and WPU2 share a common gate 136. The first butt contact 154-1 connects the common drain 152-9 to the common gate 136; and the second butt contact 154-2 connects the common drain 152-4 to the common gate 142. Thus, the two inverters are cross-coupled to form the storage unit. The butt contacts may be formed by various interconnect technique.

In one embodiment, the interconnection between the drain (or source) to the gate is achieved by a local interconnect (LI) technology. For example, the local interconnect is formed using the gate electrode material, such as polysilicon. In this situation, the polysilicon is used not only to form gate electrode but also to form interconnect. More particularly, the gate electrode is extended to the targeted drain (or source) region and directly lands on the silicon substrate within the targeted source region. In other example, the butt contacts are elongated contacts oriented in the second direction and are formed simultaneously with other contacts (such as long contacts) in a same procedure that includes, dielectric deposition, patterning and metal deposition.

The DP SRAM cell 100 also includes various gate contacts 156, such as gate contacts 156-1, 156-2 and 156-3 landing on the gates 144, 140 and 138, respectively. The long contacts 152, the butt contacts 154 and the gate contacts 156 are contacts for different routing functions and are designed to have different shapes and orientations. For examples, the long contact 152 has an elongated shape oriented with its length along the first direction 116. The butt contact 154 has an elongated shape oriented with its length along the second direction 118. The gate contacts 156 may have a square shape. Those contacts may be formed by different technologies with different compositions, or alternatively may be formed all together by a same contact forming procedure. For example, the contact forming procedure may include, forming a dielectric material layer on the substrate; forming contacts holes (or contact trenches) in the dielectric material layer by a lithography process and etching; filling the contacts holes with a conductive material, such as tungsten, copper or other suitable material; and performing a chemical mechanical polishing to remove excessive conductive material from the top surface.

Figure 6:
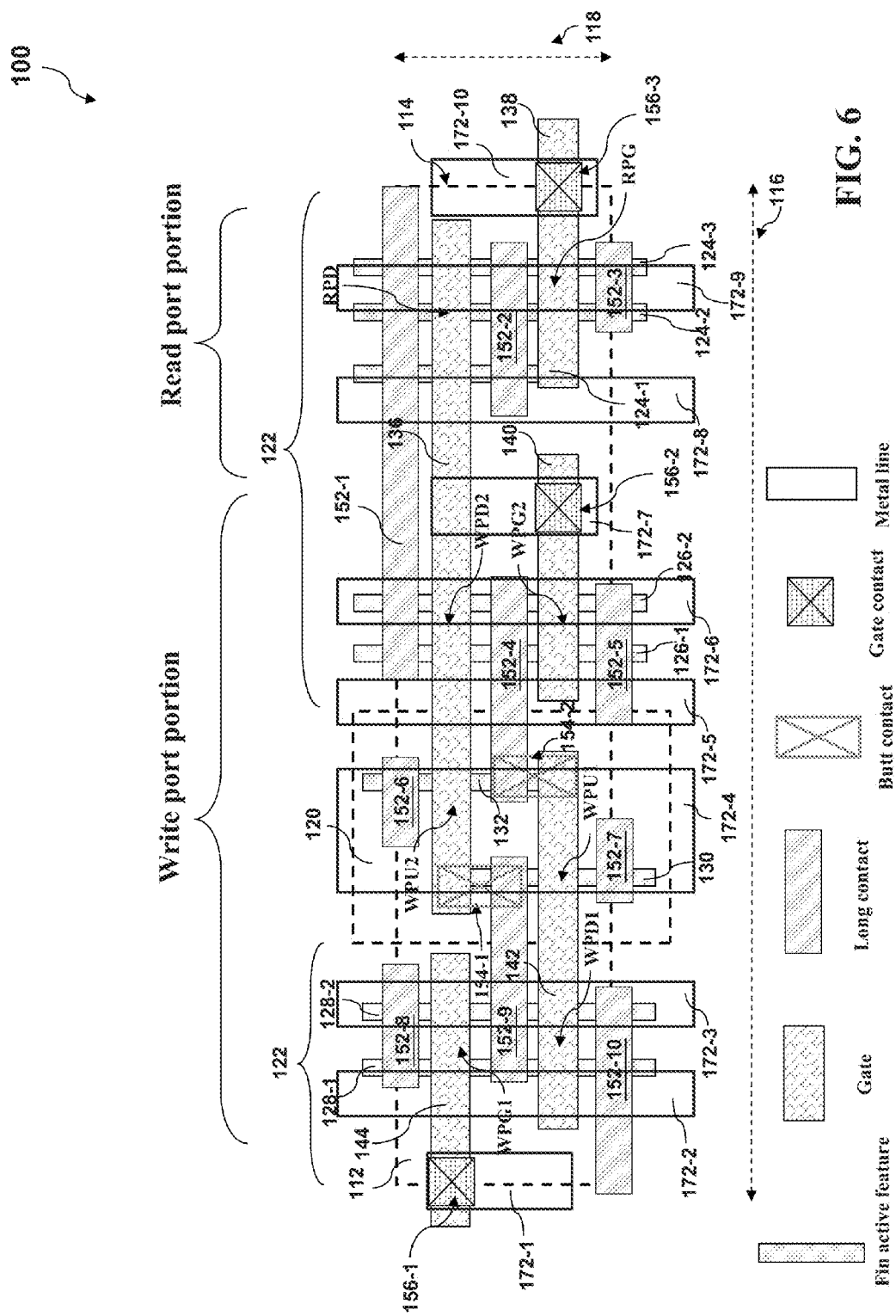
Figure 7:
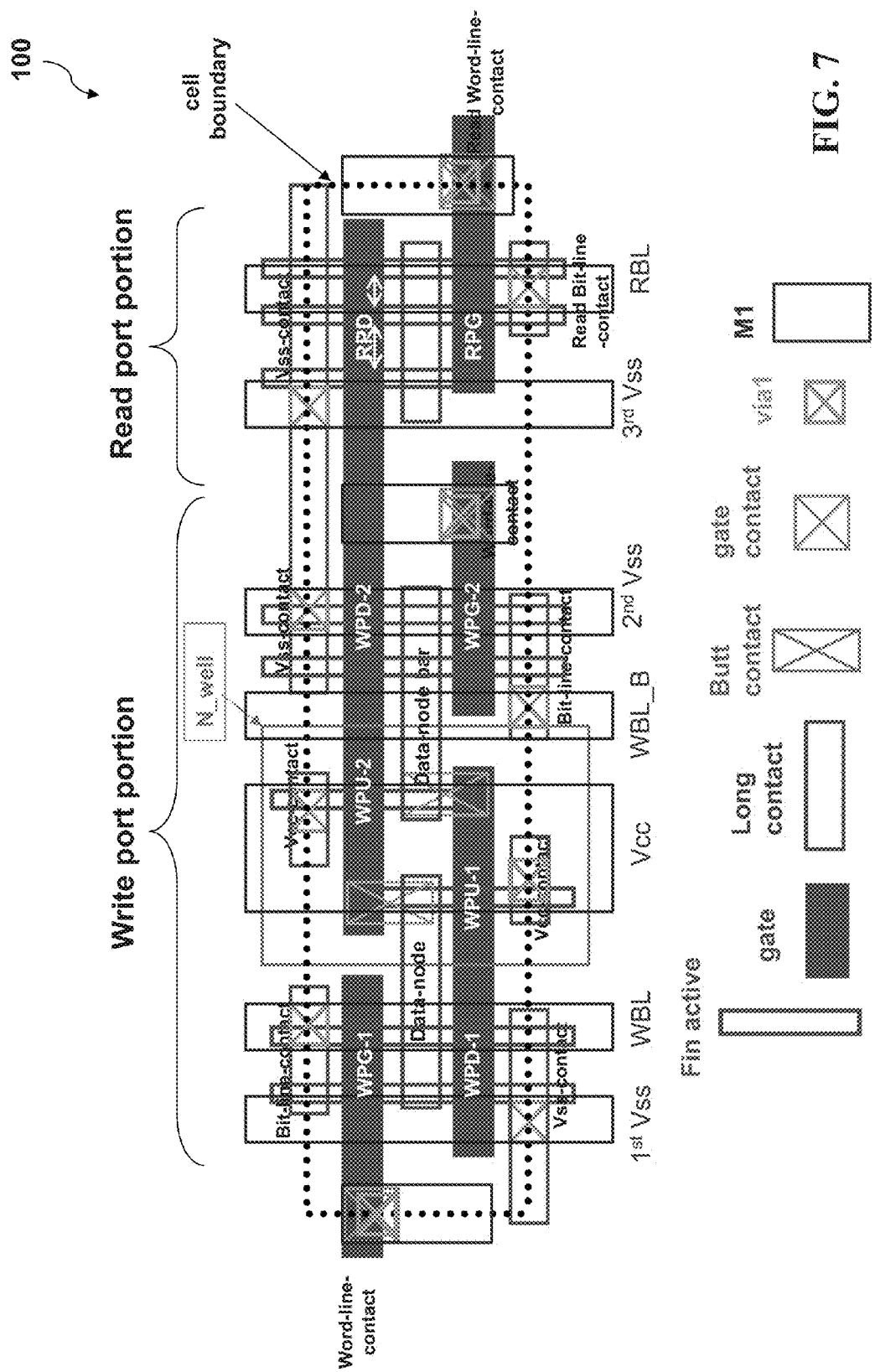

FIG. 6 illustrates a top view of the DP SRAM cell 100, further including additional interconnect features (such as metal lines), in accordance with some embodiments. Metal lines are further formed thereon and configured to connect various FinFETs into a functional DP SRAM cell. In the present example, metal lines 172 (such as 172-1 through 172-10) in the first metal layer are formed and land on the various contacts, such as long contacts 152, butt contacts 154 and gate contacts 156. The metal lines 172 are disposed in parallel and are oriented in the second direction 118. FIG. 7 is a top view of a DP SRAM cell 100 constructed in accordance with some embodiments. The DP SRAM cell 100 in is similar to the DP SRAM cell 100 in FIG. 6 and further includes via features ("Via1") landing on respective metal lines 172.

Collectively referring to FIGS. 6 and 7, the metal line 172-1 is configured to connect with a word line in the write port; the metal line 172-2 is connected to a power line Vss ("$1^{st}$ Vss"); the metal line 172-3 is connected to a bit line in the write port; the metal line 172-4 is connected to a power line Vcc ("Vcc"); the metal line 172-5 is connected to another bit line ("WBL-B") in the write port; the metal line 172-6 is connected to a second power line Vss ("$2^{nd}$ Vss"); the metal line 172-7 is connected to a word line in the write port; the metal line 172-8 is connected to a third power line Vss ("$3^{rd}$ Vss"); the metal line 172-9 is connected to a bit line in the read port; and the metal line 172-10 is connected to a word line in the read port.

Figure 8:
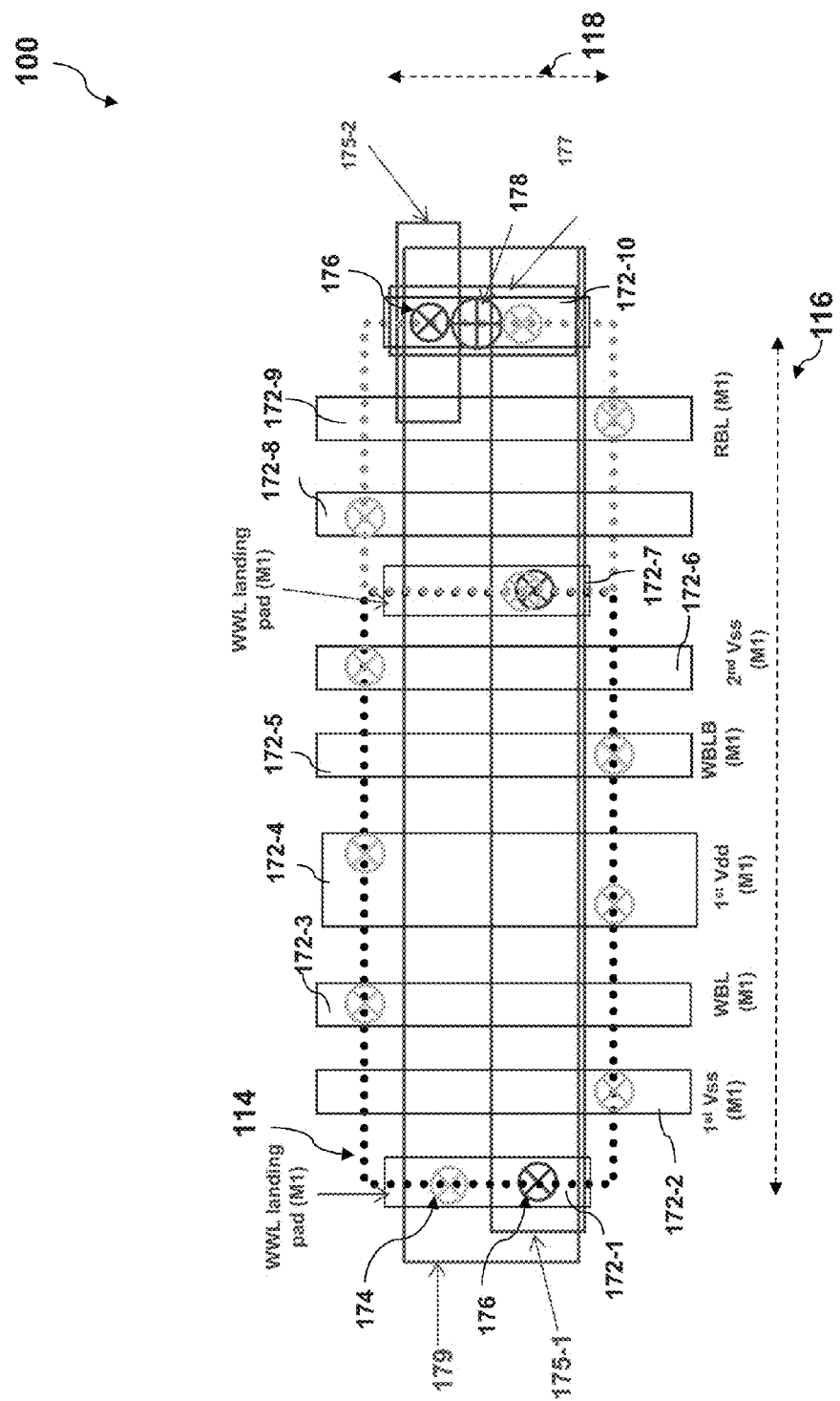
FIG. 8 is a top view of a DP SRAM device, in accordance with some embodiments.

8 is a top view of a DP SRAM cell 100, in portion, constructed in accordance with some embodiments. In FIG. 8, the second metal layer is further included. For better demonstration, only the metal lines 172 in the first metal layer and other interconnection features above the first metal layer are illustrated. For example, the via features are referred to as "Via1" in FIG. 7 and are referred to as 174 in FIG. 8. The via features ("Via1") 174 are landed on respective metal lines 172 in the first metal layer (as noted above), and further connect to respective overlying metal lines 175 in the second metal layer. The via features ("Via2") 176 are landed on respective metal lines 175 in the second metal layer, and further connect to respective overlying metal lines 177 in the third metal layer. The via features ("Via3") 178 are landed on respective metal lines 177 in the third metal layer, and further connect to respective overlying metal lines 179 in the fourth metal layer.

Particularly, the metal line 156-1 is configured to connect with a word line in the write port; the metal line 156-2 is connected to a power line Vss ("$1^{st}$ Vss"); the metal line 156-3 is connected to a bit line in the write port; the metal line 156-4 is connected to a power line Vcc ("Vcc"); the metal line 156-5 is connected to another bit line ("WBL-B") in the write port; the metal line 156-6 is connected to a second power line Vss ("$2^{nd}$ Vss"); the metal line 156-7 is connected to a word line in the write port; the metal line 156-8 is connected to a third power line Vss ("$3^{rd}$ Vss"); the metal line 156-9 is connected to a bit line in the read port; and the metal line 156-10 is connected to a word line in the read port.

The second metal layer includes metal lines 175-1 and 175-2 oriented along the first direction 116. The metal line 175-1 is connected to the metal line 172-1 through a via feature 174 and is further connected to the write line in the write port. The metal line 175-2 is connected to the metal line 172-10 through a via feature 174 and is further connected to the write line in the read port. The metal line 177 in the third metal layer is oriented in the second direction 118. The metal line 177 in the third metal layer is connected to the metal line 175-2 through a via feature 176 and is further connected to the write line in the read port. The metal line 179 in the fourth metal layer is oriented in the first direction 116. The metal line 179 in the fourth metal layer is connected to the metal line 177 through a via feature 178 and is further connected to the write line in the read port.

Figure 9:
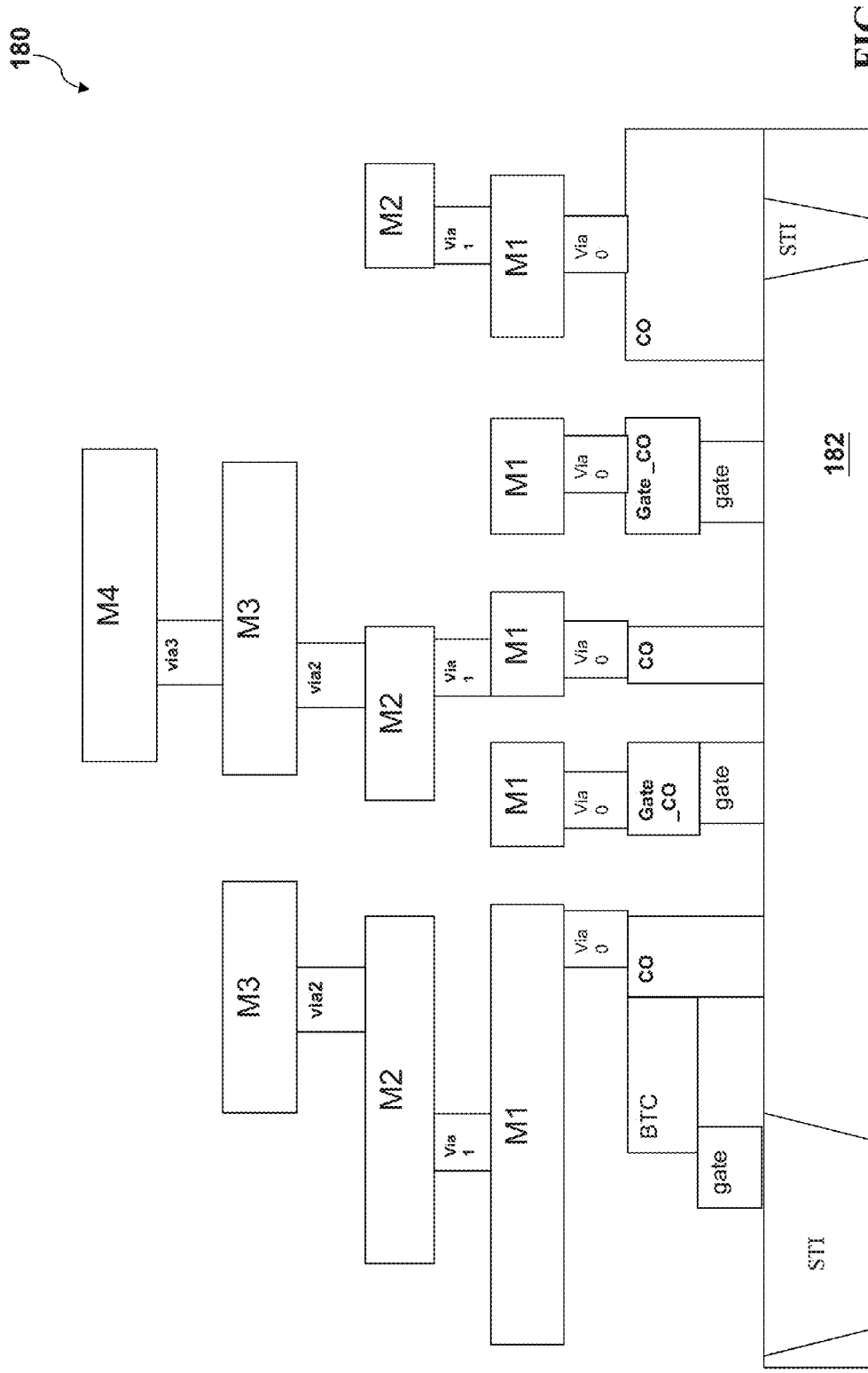
FIG. 9 is a sectional view of a DP SRAM device or a portion thereof constructed according to various aspects of the present disclosure in various embodiments.

FIG. 9 is a sectional view of an interconnection structure 180 of the DP SRAM cell formed on a substrate 182. The interconnection structure includes various contacts, metal lines and vias. The substrate 182 includes various isolation features (such as STI and labeled as "STI" in FIG. 8) formed therein and defining various active regions separated from each other by the isolation features. Various gates (labeled as "gate") are formed on the active regions of the substrate 182. The interconnect structure 180 includes various contacts, such as long contacts (labeled as "CO"), butt contacts (labeled as "BTC), and gate contacts (labeled as "Gate_CO"). The contacts land on respective source/drain features, gates, or both source/drain and gate.

The interconnect structure 180 also includes various metal layers, such as the first metal layer ("M1"), the second metal layer ("M2"), the third metal layer ("M3") and the fourth metal layer ("M4") successively disposed on the substrate 182 and vertically connected by via features in respective via layers, such as the first via layer ("Via1") between the M1 and M2 layers, the second via layer ("Via2") between the M2 and M3 layers, and the third via layer ("Via3") between the M3 and M4 layers.

Particularly, the interconnect structure 180 may include additionally a via zero layer ("Via-0") disposed between the contact layer and M1 layer. The Via-0 features in the Via-0 layer are configured to contact the underlying contact feature in the contact layer and the overlying metal line in the M1 layer. The Via-0 features in the Via-0 layer provide space enhancement such that contact features properly electrically connected with respective metal lines in the M1 layer, especially in a high packing layout. For example, adjacent gates are close to each other, leaving limited space between the adjacent gates. A contact feature may have a small dimension in the top view such that the contact feature is able to fit in the limited space. The corresponding Via-0 feature may have a greater dimension to land on the underlying contact feature and still have dimension large enough such that the overlying metal line is able to land on the Via-0 feature.

The present disclosure provides a dual-port SRAM cell structure and a layout with multiple pull-sown devices and multiple pass-gate devices configured such that the number of FinFETs in RPD is greater than the number of FinFETs in RPG. The fin active features in the read port are designed to different structures and different space settings. The disclosed structure and layout are also good for high-k/metal-gate. In various embodiments, the disclosed DP SRAM device addresses various issues noted in the background. One or more other advantages may present in various embodiments. In the present embodiment, the fin active features are straight and some are long and continuous to form two FinFETs, such as pull-down devices and/or pass-gate devices, to provide a better device tracking/matching between the pass-gate devices and pull-down devices on a wider range operation voltage (from the highest to the lowest Vdd operation). In another example, the simple shape of the active regions solves pull-down device current crowding issue as well as lithography proximity effect. In another example of lower operation voltage, the higher beta ratio is achieved and provides better static noise margin (SNM) performance for the cell stability. Furthermore, the different numbers of FinFETs for RPD and RPG reduces read bit line capacitance and leakage, and improves the read current. The different space settings for the fin active features in the read port also enlarge the process window and increase the manufacturing yields.

Thus, the present disclosure provides a dual port static random access memory (SRAM) cell in accordance with some embodiments. The dual-port SRAM cell includes a write port portion and a read port portion. The write port further includes a first pull up device (WPU1) and a second pull up device (WPU2); a first pull down device (WPD1) and a second pull down device (WPD2); and a first pass gate device (WPG1) and a second pass gate device (WPG2). The WPU1, WPU2, WPD1 and WPD2 are configured to form two cross-coupled inverters for data storage, wherein the WPG1 and WPG2 are connected to the two cross-coupled inverters for writing. The read port portion further includes a read pull down device (RPD) and a read pass gate device (RPG) connected to the two cross-coupled inverters for reading. Each of the WPU1 and WPU2 includes a single fin field-effect transistor (FinFET). Each of the WPD1, WPD2, WPG1, WPG2, RPD and RPG includes multiple fin field-effect transistors (FinFETs). Each of the WPD1 and WPD2 includes a first number n1 of FinFETs, and each of the WPG1 and WPG2 includes a second number n2 of FinFETs. The RPD includes a third number n3 of FinFETs, the RPG includes a fourth number n4 of FinFETs, n1 equals n2, and n3 is greater than n4.

The present disclosure also provides a dual port static random access memory (SRAM) cell in accordance with some other embodiments. The DP SRAM cell includes two cross-coupled inverters for date storage, wherein the two cross-coupled inverters include a first pull up device (WPU1), a second pull up device (WPU2), a first pull down device (WPD1) and a second pull down device (WPD2); a write port that includes a first pass gate device (WPG1) and a second pass gate device (WPG2) connected to the two cross-coupled inverters for writing; and a read port that includes a read pull down device (RPD) and a read pass gate device (RPG) connected to the two cross-coupled inverters for reading, wherein the RPD includes three fin field-effect transistors (FinFETs), and the RPG includes two FinFETs.

The present disclosure provides a dual port static random access memory (SRAM) cell. The dual-port SRAM cell includes two cross-coupled inverters for date storage, wherein the two cross-coupled inverters include a first pull up device (WPU1), a second pull up device (WPU2), a first pull down device (WPD1) and a second pull down device (WPD2); a write port that includes a first pass gate device (WPG1) and a second pass gate device (WPG2) connected to the two cross-coupled inverters for writing; a read port that includes a read pull down device (RPD) and a read pass gate device (RPG) connected to the two cross-coupled inverters for reading, wherein the RPD includes three fin field-effect transistors (FinFETs), and the RPG includes two FinFETs; and a first, second and third fin active features disposed within a read port. The fin active feature has a discontinuous structure. Each of the second and third active features has a continuous structure that extends to two adjacent SRAM cell. The second fin active feature is spaced a first distance from the first fin active feature and is spaced a second distance from the third fin active feature, the second distance being less than the first distance. The RPD includes three fin field-effect transistors (FinFETs) formed on the first, second and third fin active features, respectively. The RPG includes two FinFETs formed on the second and third fin active features, respectively.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A dual port static random access memory (SRAM) cell comprising:
  a write port portion, wherein the write port portion further includes
    a first pull up device (WPU1) and a second pull up device (WPU2);
    a first pull down device (WPD1) and a second pull down device (WPD2); and
    a first pass gate device (WPG1) and a second pass gate device (WPG2), wherein the WPU1, WPU2, WPD1 and WPD2 are configured to form two cross-coupled inverters for data storage, wherein the WPG1 and WPG2 are connected to the two cross-coupled inverters for writing; and
  a read port portion, wherein the read port portion further includes a read pull down device (RPD) and a read pass gate device (RPG) connected to the two cross-coupled inverters for reading, wherein
    each of the WPU1 and WPU2 includes a single fin field-effect transistor (FinFET), each of the WPD1, WPD2, WPG1, WPG2, RPD and RPG includes multiple fin field-effect transistors (FinFETs),
each of the WPD1, WPD2, WPG1 and WPG2 includes the same number of FinFETs, and
the RPD includes a larger number of FinFETs than the RPG includes.

2. The dual port SRAM cell of claim 1, wherein the numbers of FinFETs in the RPD and the RPG in the read port provides a ratio that is equal to 3/2.

3. The dual port SRAM cell of claim 2, wherein the RPD includes three FinFETs and the RPD includes two FinFETs.

4. The dual port SRAM cell of claim 1, wherein the RPD includes three FinFETs having a commonly connected source, a commonly connected drain, and a commonly connected gate.

5. The dual port SRAM cell of claim 4, wherein the RPG includes two FinFETs having a common source, a common drain, and a common gate.

6. The dual port SRAM cell of claim 5, wherein the three FinFETs in the RPD includes a first, second and third FinFETs formed on a first, second, and third fin active features, respectively, wherein
the first fin active feature is spaced a first distance S1 from the second fin active feature in a first direction,
the second fin active feature is spaced a second distance S2 from the third fin active feature in the first direction, and
the second distance S2 is different from the first distance S1.

7. The dual port SRAM cell of claim 6, wherein the S1 and S2 has a ratio S1/S2 greater than 1.2.

8. The dual port SRAM cell of claim 6, wherein the two FinFETs in the RPG are formed on the second and the third fin active features.

9. The dual port SRAM cell of claim 8, wherein
the first fin active feature extends a first length in a second direction being orthogonal to the first direction;
the second fin active feature extends a second length in the second direction;
the third fin active feature extends a third length in the second direction;
each of the second and third lengths is greater than the first length.

10. The dual port SRAM cell of claim 8, wherein
the first fin active feature has a discontinuous structure with one end overlapped with a gate of the RPG in a top view;
the second fin active feature has a continuous structure extending to multiple SRAM cells; and
the third fin active feature has a continuous structure extending to multiple SRAM cells.

11. The dual port SRAM cell of claim 10, wherein
the WPD2 of the write port includes two FinFETs formed on two fin active features, respectively,
the two FinFET of the WPD2 includes a commonly connected gate formed on the two fin active features, and
the commonly connected gate of the WPD2 extends in the first direction to directly contact the commonly connected gate of the RPD.

12. The dual port SRAM cell of claim 11, wherein the single FinFET of the WPU2 includes a gate formed on a single fin active feature, wherein the gate of the WPU2 extends in the first direction to directly contact the commonly connected gate of the WPD2.

13. The dual port SRAM cell of claim 12, wherein
the two fin active features extend in the second direction; and
the two FinFETs of the WPG2 are formed on the two fin active features.

14. A dual port static random access memory (SRAM) cell comprising:
two cross-coupled inverters for date storage, wherein the two cross-coupled inverters include a first pull up device (WPU1), a second pull up device (WPU2), a first pull down device (WPD1) and a second pull down device (WPD2);
a write port that includes a first pass gate device (WPG1) and a second pass gate device (WPG2) connected to the two cross-coupled inverters for writing; and
a read port that includes a read pull down device (RPD) and a read pass gate device (RPG) connected to the two cross-coupled inverters for reading, wherein the RPD includes three fin field-effect transistors (FinFETs), and the RPG includes two FinFETs.

15. The dual port SRAM cell of claim 14, wherein the three FinFETs in the RPD includes a commonly connected source, a commonly connected drain, and a commonly connected gate.

16. The dual port SRAM cell of claim 15, wherein the two FinFETs in the RPG includes a common source, a common drain, and a common gate.

17. The dual port SRAM cell of claim 16, wherein the three FinFETs in the RPD includes a first, second and third FinFETs formed on a first, second, and third fin active features, respectively, wherein
the first fin active feature is spaced a first distance S1 from the second fin active feature in a first direction,
the second fin active feature is spaced a second distance S2 from the third fin active feature in the first direction, and
the second distance S2 is different from the first distance S1.

18. The dual port SRAM cell of claim 17, wherein the 51 and S2 has a ratio S1/S2 greater than 1.2.

19. The dual port SRAM cell of claim 17, wherein the two FinFETs in the RPG are formed on the second and the third fin active features.

20. A dual port static random access memory (SRAM) cell comprising:
two cross-coupled inverters for date storage, wherein the two cross-coupled inverters include a first pull up device (WPU1), a second pull up device (WPU2), a first pull down device (WPD1) and a second pull down device (WPD2);
a write port that includes a first pass gate device (WPG1) and a second pass gate device (WPG2) connected to the two cross-coupled inverters for writing;
a read port that includes a read pull down device (RPD) and a read pass gate device (RPG) connected to the two cross-coupled inverters for reading, wherein the RPD includes three fin field-effect transistors (FinFETs), and the RPG includes two FinFETs; and
a first, second and third fin active features disposed within a read port, wherein
the first fin active feature has a discontinuous structure,
the second and third active features each have a continuous structure that extends to two adjacent SRAM cell,
the second fin active feature is spaced a first distance from the first fin active feature and is spaced a second distance from the third fin active feature, the second distance being less than the first distance, the RPD includes three fin field-effect transistors (Fin-FETs) formed on the first, second and third fin active features, respectively, and the RPG includes two FinFETs formed on the second and third fin active features, respectively.

\* \* \* \* \*